United States Patent [19]
Park et al.

[11] Patent Number: 5,780,352
[45] Date of Patent: Jul. 14, 1998

[54] METHOD OF FORMING AN ISOLATION OXIDE FOR SILICON-ON-INSULATOR TECHNOLOGY

[75] Inventors: Heemyong Park, Gilbert; Wen-Ling Margaret Huang, Phoenix; Juergen Foerstner, Mesa; Marco Racanelli, Phoenix, all of Ariz.

[73] Assignee: Motorola, Inc., Schaumburg, Ill.

[21] Appl. No.: 553,801

[22] Filed: Oct. 23, 1995

[51] Int. Cl.$^6$ .................................................. H01L 21/76
[52] U.S. Cl. .................................................................... 438/404
[58] Field of Search ............... 437/69, 70; 148/DIG. 85, 148/DIG. 86, DIG. 117; 438/404, 222, 452

[56] References Cited

U.S. PATENT DOCUMENTS

| | | |
|---|---|---|
| 5,145,802 | 9/1992 | Tyson et al. |
| 5,151,381 | 9/1992 | Liu et al. |
| 5,334,550 | 8/1994 | McElroy et al. |
| 5,358,890 | 10/1994 | Sivan et al. |
| 5,374,586 | 12/1994 | Huang et al. ........................... 437/69 |
| 5,422,287 | 6/1995 | So. |

FOREIGN PATENT DOCUMENTS

| | | |
|---|---|---|
| 266885 | 4/1989 | Germany. |
| 58-27341 | 2/1983 | Japan. |
| 58-44748 | 3/1983 | Japan. |
| 60-167349 | 8/1985 | Japan. |
| 1-161848 | 6/1989 | Japan. |
| 3-234024 | 10/1991 | Japan. |
| 3-236235 | 10/1991 | Japan. |
| 5-29330 | 2/1993 | Japan. |
| 5-4775 | 2/1993 | Japan. |
| 5-152427 | 6/1993 | Japan. |

OTHER PUBLICATIONS

E.P. EerNisse–Sandia Laboratories N.M., Applied Physics Letters35(1), "Stress in Thermal SiO$_2$ During Growth", Jul. 1, 1979, pp. 8–10.

E.P. EerNisse–Sandia Laboratories N.M., Applied Physics Letters—vol. 30, No. 6, "Viscous Flow of Thermal SiO$_2$", Mar. 15, 1977, pp. 290–293.

B.E. Deal and A.S. Grove, Journal of Applied Physics—vol. 36, No. 12, "General Relationship for the Thermal Oxidation of Silicon", Dec. 1965, pp. 3770–3778.

Primary Examiner—George R. Fourson
Attorney, Agent, or Firm—George C. Chen

[57] ABSTRACT

A method of forming an isolation oxide (30) on a silicon-on-insulator (SOI) substrate (21) includes disposing a mask layer (26, 27) over a region of a silicon layer (24) of the SOI substrate (21). The isolation oxide (30) is grown in a different region (28) of the silicon layer (24). The isolation oxide (30) is grown to a depth (32) within the silicon layer (24) of less than or equal to a thickness (29) of the silicon layer (24). After removing the mask layer (26, 27), the isolation oxide (30) is further grown in the different region (28) of the silicon layer (24) such that the isolation oxide (30) is coupled to a buried electrically insulating layer (23) within the SOI substrate (21). The buried electrically insulating layer (23) and the isolation oxide (30) electrically isolate an active region (43) of a semiconductor device (20).

18 Claims, 2 Drawing Sheets

METHOD OF FORMING AN ISOLATION OXIDE FOR SILICON-ON-INSULATOR TECHNOLOGY

BACKGROUND OF THE INVENTION

This invention relates, in general, to silicon-on-insulator technology, and more particularly, to a method of forming an oxide layer on a silicon-on-insulator substrate.

To electrically isolate silicon islands or semiconductor devices in a silicon-on-insulator (SOI) substrate, a conventional technique uses a localized oxidation of silicon (LOCOS) process where a masking layer covers a region of the SOI substrate while the uncovered or exposed region of the SOI substrate is thermally oxidized to form a field oxide layer. During the LOCOS process, a buried oxide layer of the SOI substrate serves as an oxidation path for lateral encroachment of the field oxide layer on the electrically isolated silicon islands. The lateral encroachment produces high compressive stresses against edges of the electrically isolated silicon islands. The high compressive stresses create crystalline defects such as, for example, stacking faults, edge dislocations, and misfit dislocations within the silicon islands. The crystalline defects are produced to relax the high compressive stresses. However, the crystalline defects also cause semiconductor device leakage and degrade integrated circuit probe yields and reliability.

Whether using a conventional LOCOS process or a poly-buffered-LOCOS process, lateral encroachment of the field oxide layer on the silicon islands is poorly controlled. This poor control is magnified in an SOI substrate when the field oxide layer contacts the buried oxide layer of the SOI substrate. Lateral diffusion of oxidant atoms along the buried oxide interface causes oxidation of the silicon islands edges at the buried oxide interface, thereby aggravating the lateral encroachment of oxide. This lateral encroachment produces locally accumulated high stresses within the silicon islands.

Accordingly, a need exists for a method of forming an isolation oxide on an SOI substrate which reduces stress and, therefore, reduces the formation of crystalline defects in the edges of the silicon islands in order to reduce semiconductor device leakage and to improve integrated circuit reliability and probe yields. The method should be manufacturable, cost efficient, and compatible with existing semiconductor device processes.

DETAILED DESCRIPTION OF THE DRAWINGS

A method of forming an isolation oxide on a silicon-on-insulator (SOI) substrate includes disposing a mask layer over a region of a silicon layer of the SOI substrate. Subsequently, the isolation oxide is grown in a different region of the silicon layer of the SOI substrate. The isolation oxide is grown to a depth within the silicon layer of less than or equal to a thickness of the silicon layer. After removing the mask layer, the isolation oxide is grown further into the different region of the silicon layer such that the isolation oxide is coupled to a buried electrically insulating layer of the SOI substrate. The buried electrically insulating layer and the isolation oxide electrically isolate a silicon island or an active region of a semiconductor device.

The present invention applies to all types of local-oxidation-of-silicon (LOCOS) isolation processes including poly-buffered-LOCOS. As an example, FIGS. 1 through 4 describe an application of the present invention in a poly-buffered-LOCOS process.

Figure 1:
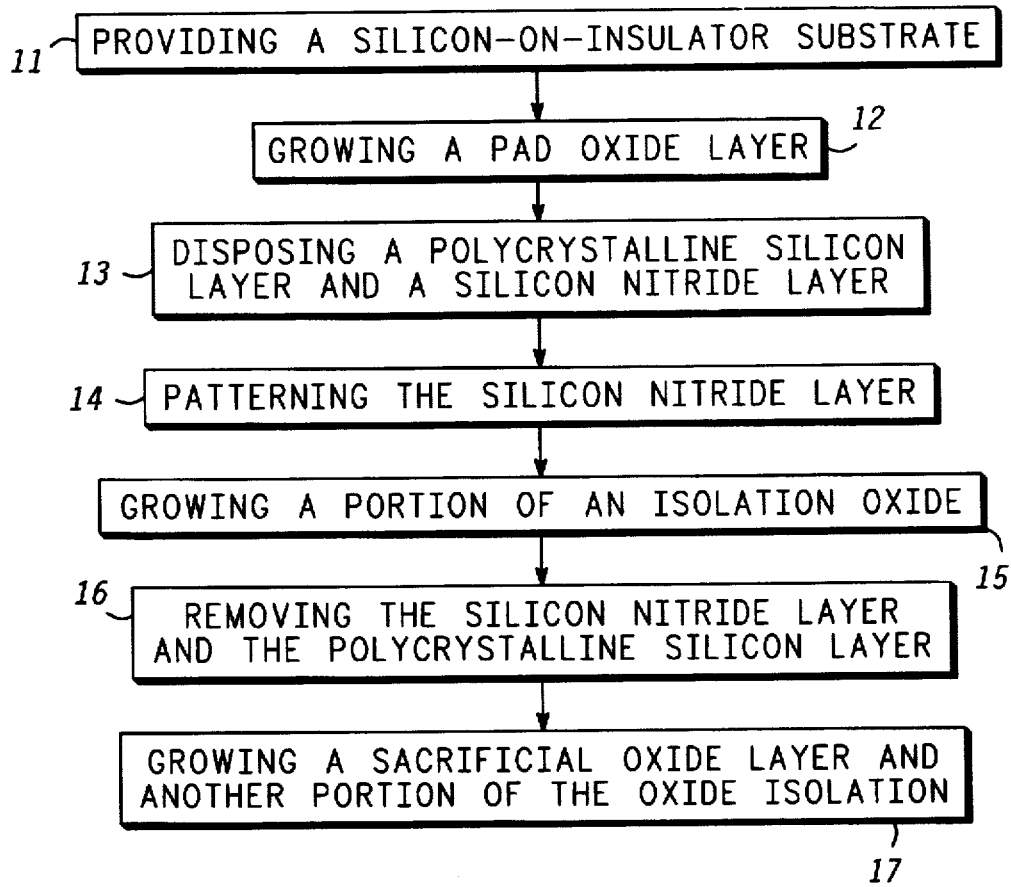
FIG. 1 outlines process steps for a method of forming an isolation oxide on a silicon-on-insulator substrate in accordance with the present invention.

Turning to the figures for a more detailed description, FIG. 1 outlines process steps for a method of forming an isolation oxide on a silicon-on-insulator substrate in accordance with the present invention. Process or method 10 begins with step 11 which provides an SOI substrate, continues with step 12 which grows a pad oxide layer, and follows with step 13 which disposes a silicon layer and a silicon nitride layer.

Figure 2:
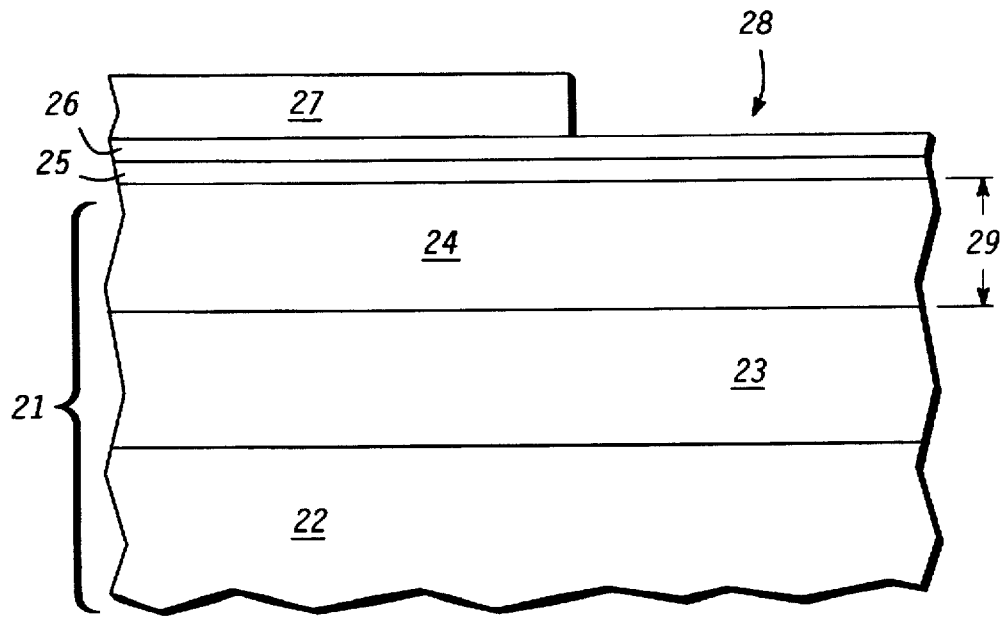
FIGS. 2, 3, and 4 illustrate partial cross-sectional views of the process steps during formation of an isolation oxide on a silicon-on-insulator substrate in accordance with the present invention.

In accordance with the present invention, FIG. 2 illustrates a partial cross-sectional view of a semiconductor device after the aforementioned process steps 11, 12, and 13. FIG. 2 portrays a portion of a silicon-on-insulator substrate 21 having a semiconductor device 20. Silicon-on-insulator (SOI) substrate or substrate 21 comprises a silicon layer 22 which is beneath or under a buried oxide layer 23 which is, in turn, beneath or under a silicon layer 24. Buried oxide layer or oxide layer 23 can have an approximate thickness of, for example, 800–10,000 angstroms (Å), and silicon layer 24 can have a thickness 29 of approximately 500–3,000 Å, for example. Substrate 21 can be manufactured using processes including, but not limited to, dielectric isolation (DI), wafer bonding, separation by implanted oxygen (SIMOX), zone-melting recrystallization (ZMR), full isolation by porous oxidized silicon (FIPOS), and selective oxidation with selective epitaxial growth.

In a preferred embodiment, a pad oxide layer 25 is provided over silicon layer 24 of substrate 21 as depicted in FIG. 2 and as outlined in step 12 of FIG. 1. Pad oxide layer 25 can be deposited using a chemical vapor deposition (CVD) technique but is preferably thermally grown in an oxygen ambient to a thickness greater than 50 Å. Pad oxide layer 25 serves as a transition region to cushion the stresses between substrate 21 and a subsequently deposited mask layer.

Continuing with step 13 of FIG. 1, a silicon layer 26 and a silicon nitride layer 27 are provided over pad oxide layer 25 and substrate 21. Silicon layer 26 can be crystalline, polycrystalline, or amorphous. First, silicon layer or layer 26 is disposed over pad oxide layer 25 using, for example, a pyrolysis of silane gas in a CVD process. Second, silicon nitride layer 27 is disposed over layer 26 also using, for example, a CVD technique and a silane gas. Layer 26 represents a silicon layer used in a process known as poly-buffered-localized-oxidization-of-silicon (poly-buffered-LOCOS or PBL). Alternatively, if a PBL process is not used, a different LOCOS process can be used which deposits silicon nitride layer 27 directly on pad oxide layer 25 and does not use layer 26.

After the deposition of layer 26 and silicon nitride layer 27, a patterned photoresist layer (not shown) is used during an etch process, embodied as step 14 in FIG. 1, that removes silicon nitride layer 27 from a region 28 of substrate 21 as illustrated in FIG. 2. Although not depicted in FIG. 2, a portion of layer 26 in region 28 can also be removed if desired. In the preferred embodiment, a dry etch, preferably a reactive ion etch (RIE) using a fluorine based plasma such as carbon tetrafluoride ($CF_4$), for example, is used to etch silicon nitride layer 27. Another RIE etch using a plasma containing sulfur hexafluoride (SF$_6$) or chlorine (Cl$_2$), among other chemistries, is preferably used to etch layer 26. FIG. 2 portrays a partial view of semiconductor device 20 after etching of layer 26 and silicon nitride layer 27 and after removal of the patterned photoresist layer.

Figure 3:
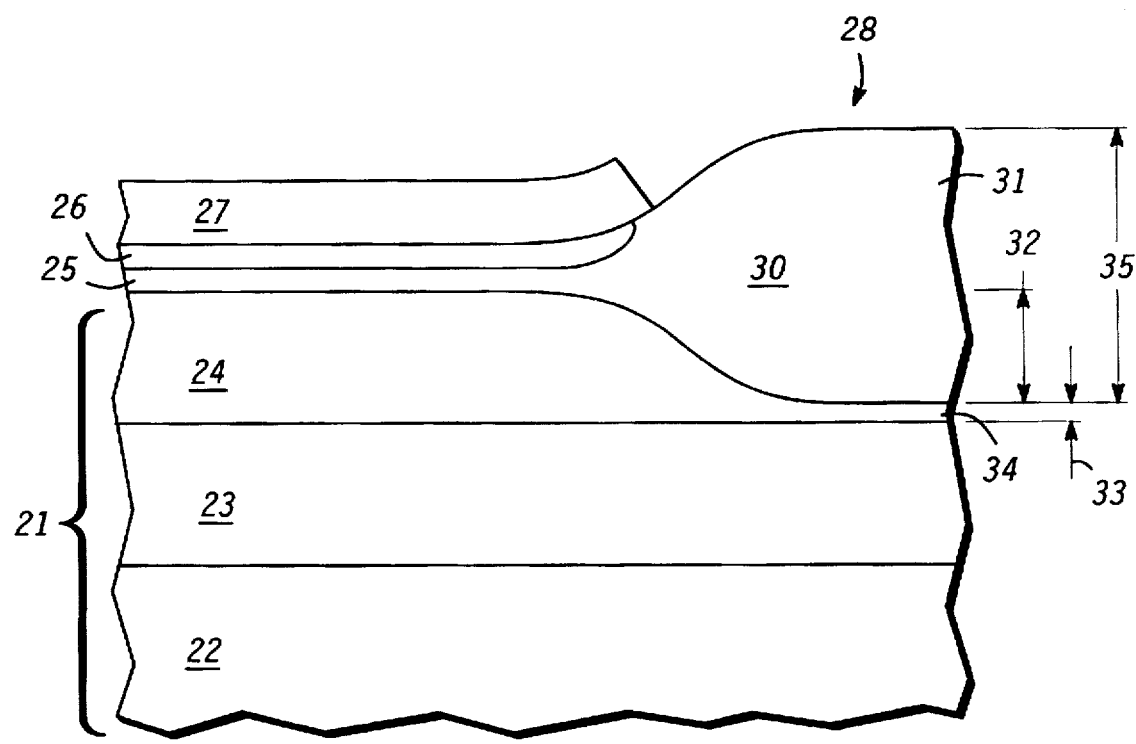

Referring to the next process step of FIG. 1, step 15 indicates growing a portion of an isolation oxide, and FIG. 3 illustrates semiconductor device 20 supported by substrate 21 after growth of a portion 31 of an isolation oxide 30 in region 28 of silicon layer 24. Silicon nitride layer 27 and layer 26 serve as mask layer 26 and mask layer 27, respectively, to protect certain regions of silicon layer 24 during the oxidation process. The regions of silicon layer 24 under mask layers 26 and 27 are not significantly oxidized during step 15.

As represented in FIG. 3, isolation oxide 30 is grown into silicon layer 24 such that portion 31 of isolation oxide 30 does not contact buried oxide layer 23 and such that region 34 of silicon layer 24 remains between portion 31 of isolation oxide 30 and buried oxide layer 23. In an alternative embodiment (not shown) of FIG. 3, the growth of isolation oxide 30 is terminated just as portion 31 contacts buried oxide layer 23.

The above described process is different from the prior art where the isolation oxide is typically grown to a thickness of two to three times the thickness of silicon layer 24. In such prior art cases where an isolation oxide is over-grown, lateral encroachment of the isolation oxide on a silicon island causes highly localized compressive stress, particularly shear stress, which produces defects within the crystalline structure of the electrically isolated silicon region. In fact, the excessive oxidation of the prior art produces a thick isolation oxide which induces significant amounts of compression in the electrically isolated silicon islands. Therefore, in accordance with the present invention, it is desired to terminate the growth of isolation oxide 30 either just as or just before portion 31 contacts buried oxide layer 23.

Portion 31 is preferably thermally grown in a wet oxygen ambient containing both oxygen (O$_2$) and water (H$_2$O) at a temperature of about 1,000 degrees Celsius (°C). However, it is understood that a wide variety of other processing conditions can be used to thermally grow portion 31 of isolation oxide 30. For instance, a dry oxygen ambient which does not contain H$_2$O can be used at a temperature below 1,000° C. Nevertheless, a wet oxygen ambient at approximately 1,000° C. is the preferred process because of a faster rate of silicon oxidation in a wet oxygen ambient compared to a dry oxygen ambient and because of the faster oxidation rate at a higher temperatures. Due to the large quantity of oxide which needs to be grown during step 15, a faster oxidation rate is preferred to improve the cycle time of the process embodied as process 10 in FIG. 1.

In the preferred embodiment, portion 31 of isolation oxide 30 is grown to a thickness 35; portion 31 of isolation oxide 30 is grown to a depth 32 within silicon layer 24; and region 34 of silicon layer 24 has a thickness 33. It is a widely accepted fact that thermal oxidation of silicon can be described by the following equation:

$$D=0.44*d_{SiO_2} \quad \text{(eq. 1)}$$

where D represents depth 32 into silicon layer 24 to which portion 31 is grown, where $d_{SiO_2}$ represents thickness 35 of portion 31 of isolation oxide 30, and where the sum of depth 32 and thickness 33 approximately equals thickness 29 of silicon layer 24. A preferred technique for determining an upper limit for thickness 33 will be described in a subsequent section.

Figure 4:
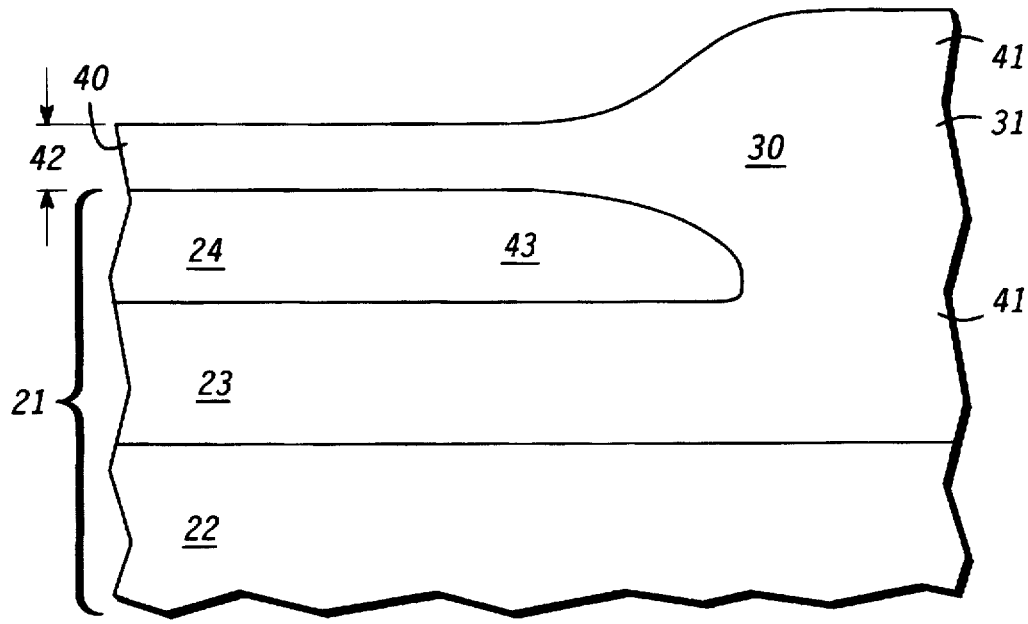

Continuing with FIG. 4, silicon nitride layer 27 and layer 26 are removed as noted in step 16 of FIG. 1. Silicon nitride layer 27 and layer 26 are preferably removed using a wet etch or anisotropic dry etch. If desired, pad oxide layer 25 can also be removed. After that, a sacrificial oxide layer 40 and portion 41 of isolation oxide 30 are grown as noted in step 17 of FIG. 1.

A single thermal growth process is preferably used to form both sacrificial oxide layer 40 and portion 41 of isolation oxide 30. Conventional processes typically require an extra step for growing a sacrificial oxide layer in order to achieve a high quality interface between a subsequently grown gate oxide and the underlying silicon island. In the present invention, the same step used for growing sacrificial oxide 40 is also used for growing portion 41, which completes the formation of isolation oxide 30. Thus, the present invention does not need an extra process step. It is noted that sacrificial oxide layer 40 is grown to a thickness 42. Furthermore, portion 41 of isolation oxide 30 is grown in region 34 of silicon layer 24 and electrically isolates an active region 43 of silicon layer 24. Active region or silicon island 43 serves as a region in which the channel, source, drain, emitter, collector, base, or other portions of semiconductor device 20 are fabricated.

While a wet oxygen ambient can be used during the growth of sacrificial oxide layer 40 and portion 41 of isolation oxide 30, a dry oxygen ambient is preferably used. With the slower oxidation rate in a dry oxygen ambient, a higher degree of control is maintained during this oxidation process which grows a smaller quantity of oxide compared to the earlier oxidation process of step 15.

A preferred growth temperature for the oxidation process of step 17 is 1,000° C. or a temperature above the temperature at which viscous flow of isolation oxide 30 occurs within the oxide surrounding active region 43. As reported by EerNisse in *Applied Physics Letters*, volume 35, number 1, July 1979, pages 8–10, the critical temperature above which the oxide starts to flow has been established to be around approximately 950° or 960° C. Therefore, above approximately 950° or 960° C., isolation oxide 30 will flow around active region 43 to electrically isolate active region 43 while minimizing compressive stress around active region 43.

The improvement through the present invention is achieved in two ways. First, the increased oxide flow at temperatures above approximately 960° C. leads to a reduction of the overall stress level within active region 43. Second, the oxide flow occurs through sacrificial oxide layer 40, isolation oxide 30, and buried oxide layer 23, thereby completely surrounding active region 43. Thus, the directivity of compression is much reduced, and the local shear stress build-up in active region 43 is lowered. This is a significant improvement over the prior art where highly-stressed silicon nitride layer 27 blocks uniform oxide flow until the completion of isolation oxide 30. The minimization of the localized strain on active region 43 impedes the formation of crystalline defects such as, for example, stacking faults and dislocations within active region 43. Consequently, semiconductor device leakage is reduced, and probe yields and reliability of the integrated circuits fabricated in substrate 21 are improved.

A possible technique for determining an upper limit for thickness 33 of region 34 in FIG. 2 is dependent upon the ratio of thickness 29 (shown in FIG. 1) of silicon layer 24 and thickness 42 (shown in FIG. 4) of sacrificial oxide layer 40. In particular, the following formula can be used:

$$\sigma \leq \left[ \frac{0.44 * m^2 * d_{Si^o}^2}{A} + (0.44 * m * d_{Si^o}) \right] \quad \text{(eq. 2)}$$

where σ is the required margin thickness 33 of region 34 in FIG. 3, $d_{Si^o}$ is the initial thickness of silicon layer 24 prior to the second oxidation of step 17, and m is defined as $$m = \frac{d_{SacOx}/d_{Si}}{1 + [0.44 * (d_{SacOx}/d_{Si})]} \quad \text{(eq. 3)}$$

where $d_{si}$ is the final thickness of silicon layer 24 after the second oxidation of step 17, and $d_{SacOx}$ is the final thickness 42 of sacrificial oxide layer 40. The parameter "A" of equation 2 is a value as used in the well-established Deal-Grove model for oxidation:

$$d_{SiO_2}^2 + (A * d_{SiO_2}) = B * (t + \tau) \quad \text{(eq. 4)}$$

where t is the oxidation time, τ is the time offset required for the initial oxide layer, and B is a temperature dependent constant. A more detailed discussion of equation 4 can be found in "General Relationship for the Thermal Oxidation of Silicon" by Deal and Grove published in *Journal of Applied Physics*, volume 36 (1965) which is hereby incorporated herein by reference.

While the upper limit for thickness 33 of region 34 can be determined from equation 2, many practical SOI applications can use an estimate of approximately 350 to 600 Å for the preferred upper limit of thickness 33.

While the invention has been particularly shown and described with reference to preferred embodiments, it will be understood by those skilled in the art that changes in form and detail may be made without departing from the spirit and scope of the invention. For instance, in an alternative embodiment, buried oxide layer 23 can comprise a different insulator such as, for example, sapphire to create a silicon-on-sapphire (SOS) substrate. Consequently, layer 23 may also be referred to as insulator layer 23. Furthermore, silicon layer 24 can comprise a different semiconductor such as, for example, gallium arsenide. Consequently, layer 24 may also be referred to as semiconductor layer 24.

Therefore, in accordance with the present invention, it is apparent there has been provided an improved method of forming an isolation oxide on a silicon-on-insulator substrate which overcomes the disadvantages of the prior art. The present invention reduces compressive stress inside the isolation oxide and the silicon island and also prevents the formation of crystalline defects within the silicon island. Consequently, the semiconductor devices fabricated with the isolation method of the present invention produce lower leakage currents, which improves the probe yields and reliability of SOI integrated circuits. The method can be easily integrated into an existing SOI process flow, is cost effective, is manufacturable, and does not significantly increase the cycle time of existing SOI process flows.

We claim:

1. A method of forming a semiconductor device comprising:

providing a silicon-on-insulator substrate with an insulator layer beneath a silicon layer, the silicon layer having a thickness;

disposing a mask layer over a first region of the silicon layer;

forming a first portion of the isolation oxide in a second region of the silicon layer after disposing the mask layer, the first portion of the isolation oxide formed to a depth into the silicon layer of less than or equal to the thickness of the silicon layer;

removing the mask layer after forming the first portion of the isolation oxide; and forming a second portion of the isolation oxide in the second region of the silicon layer after removing the mask layer wherein the second portion of the isolation oxide contacts the first portion of the isolation oxide.

2. The method according to claim 1, further including growing the second portion of the isolation oxide at a first temperature greater than a second temperature at which viscous flow of the isolation oxide occurs within the silicon layer.

3. The method according to claim 2, further including growing the second portion of the isolation oxide in a dry oxygen ambient.

4. The method according to claim 2, further including providing a temperature of approximately 960° C. for the second temperature.

5. The method according to claim 2, further comprising growing the first portion of the isolation oxide in a wet oxygen ambient at a third temperature greater than the second temperature.

6. The method according to claim 1, further including:

providing a silicon nitride layer for the mask layer; and providing a pad oxide layer under the silicon nitride layer.

7. The method according to claim 6, further including providing a polycrystalline silicon layer under the silicon nitride layer.

8. The method according to claim 1, further comprising:

providing approximately 500 to 3,000 angstroms for the thickness of the silicon layer; and growing the first portion of the isolation oxide to within approximately 600 angstroms less than the thickness of the silicon layer.

9. A method of manufacturing a semiconductor device comprising:

providing a substrate having a semiconductor layer over an insulator layer, the semiconductor layer containing an active region;

disposing an oxidation barrier over the active region;

thermally forming a first portion of an isolation oxide in a region of the semiconductor layer contiguous to the active region, the first portion of the isolation oxide separated from the insulator layer and adjacent to the oxidation barrier;

removing the oxidation barrier after thermally forming the first portion of the isolation oxide; and thermally forming a second portion of the isolation oxide in the region of the semiconductor layer at a first temperature greater than a second temperature at which viscous flow of the isolation oxide in the semiconductor layer occurs, the second portion of the isolation oxide coupled to the insulator layer to electrically isolate the active region of the semiconductor device wherein the step of thermally forming the second portion of the isolation oxide occurs after removing the oxidation barrier and before disposing another oxidation barrier over the active region.

10. The method according to claim 9, further including thermally growing the first portion of the isolation oxide in a wet oxygen ambient at a third temperature greater than the second temperature.

11. The method according to claim 9, further including thermally growing the second portion of the isolation oxide in a dry oxygen ambient.

12. The method according to claim 9, further comprising:

providing a pad oxide layer over the active region before thermally forming the first portion of the isolation oxide; and providing a layer of polycrystalline silicon between the pad oxide layer and the oxidation barrier before thermally forming the first portion of the isolation oxide.

13. The method according to claim 9, further comprising providing a silicon nitride layer for the oxidation barrier.

14. The method according to claim 9, further comprising providing a second region of the semiconductor layer separating the first portion of the isolation oxide from the insulator layer, the second region having a thickness of less than approximately 600 Å.

15. A method of forming a semiconductor device comprising:

providing a silicon-on-insulator substrate comprising a buried oxide layer beneath a silicon layer having a first thickness;

growing a pad oxide layer over the silicon-on-insulator substrate;

depositing a silicon nitride layer to cover a first region of the pad oxide layer and a first region of the silicon layer;

growing a first portion of the isolation oxide in a second region of the silicon layer over the buried oxide layer, the first portion of the isolation oxide grown to a depth into the silicon layer of less than or equal to the first thickness of the silicon layer;

removing the silicon nitride layer after growing the first portion of the isolation oxide; and simultaneously thermally growing an other oxide layer and a second portion of the isolation oxide at a first temperature greater than approximately 960° C. and in a dry oxygen ambient and after removing the silicon nitride layer, the second portion of the isolation oxide located in the second region of the silicon layer and contacting the buried oxide layer and contacting the first portion of the isolation oxide, the other oxide layer located over the first region of the silicon layer and thermally grown to a second thickness.

16. The method according to claim 15, further comprising growing the first portion of the isolation oxide to within approximately 600 Å of the buried oxide layer of the silicon-on-insulator substrate.

17. The method according to claim 15, further comprising growing the first portion of the isolation oxide at a second temperature greater than 960° C. and in a wet oxygen ambient.

18. The method according to claim 15, further comprising:

disposing a polycrystalline silicon layer over the first region of the pad oxide layer before depositing the silicon nitride layer; and removing the polycrystalline silicon layer before simultaneously thermally growing the other oxide layer and the second portion of the isolation oxide.

* * * * *